US012690312B2

(12) United States Patent
Kreiner

(10) Patent No.: US 12,690,312 B2
(45) Date of Patent: Jul. 21, 2026

(54) RADIATION-EMITTING COMPONENT AND METHOD FOR PRODUCING A RADIATION-EMITTING COMPONENT

(71) Applicant: ams-OSRAM International GmbH, Regensburg (DE)

(72) Inventor: Laura Kreiner, Regensburg (DE)

(73) Assignee: ams-OSRAM International GmbH, Regensburg (DE)

(*) Notice: Subject to any disclaimer, the term of this patent is extended or adjusted under 35 U.S.C. 154(b) by 545 days.

(21) Appl. No.: 18/007,694

(22) PCT Filed: May 19, 2021

(86) PCT No.: PCT/EP2021/063303
§ 371 (c)(1),
(2) Date: Dec. 1, 2022

(87) PCT Pub. No.: WO2021/244851
PCT Pub. Date: Dec. 9, 2021

(65) Prior Publication Data
US 2023/0231089 A1 Jul. 20, 2023

(30) Foreign Application Priority Data
Jun. 4, 2020 (DE) .......................... 102020114884.4

(51) Int. Cl.
*H10H 20/856* (2025.01)
*H10H 20/01* (2025.01)
(Continued)

(52) U.S. Cl.
CPC ......... *H10H 20/856* (2025.01); *H10K 50/856* (2023.02); *H10K 71/00* (2023.02); *H10H 20/0363* (2025.01)

(58) Field of Classification Search
CPC ............. H10H 20/856; H10H 20/0363; H10H 20/855; H10K 50/856; H10K 71/00
See application file for complete search history.

(56) References Cited

U.S. PATENT DOCUMENTS 6,111,272 A 8/2000 Heinen
6,995,030 B2 2/2006 Illek et al.
(Continued)

FOREIGN PATENT DOCUMENTS

DE 102007025092 A1 12/2008
DE 112009003123 A5 5/2012
(Continued)

OTHER PUBLICATIONS

Iridian, "How does a Dichroic Filter Work" downloaded from URL <https://www.iridian.ca/learning_center/light-notes/how-does-a-dichroic-filter-work/?srsltid=AfmBOop1jZp7fK_vIPL5XfnJj33sa2apKiARf0VA0-BM1Feg3mJO-HGG> on Nov. 12, 2025. (Year: 2025).*
(Continued)

*Primary Examiner* — J.E. Schoenholtz
(74) *Attorney, Agent, or Firm* — Slater Matsil, LLP

(57) ABSTRACT

In an embodiment a radiation-emitting component includes a radiation-emitting emitter having a front side, an optical element arranged on the front side and a dielectric filter arranged between the front side and the optical element, wherein the optical element comprises a plurality of reflection surfaces and a plurality of radiation exit surfaces, wherein each of the reflection surfaces has an angle of inclination of between 45° and 80°, inclusive, with respect to the front side, wherein a main emission direction of the radiation-emitting component includes an exit angle between 10° and 80°, inclusive, with the front side, and wherein the dielectric filter is configured to transmit radiation having an entrance angle within a first angular range and
(Continued)

to reflect radiation having an entrance angle within a second angular range.

13 Claims, 4 Drawing Sheets

(51) Int. Cl.
      *H10K 50/856*           (2023.01)
      *H10K 71/00*            (2023.01)

(56)                    References Cited

U.S. PATENT DOCUMENTS

| | | | | |
|---|---|---|---|---|
| 8,354,682 | B2 * | 1/2013 | Eberhard | H10H 20/84 |
| | | | | 257/E33.071 |
| 8,405,104 | B2 | 3/2013 | Streubel et al. | |
| 8,981,397 | B2 * | 3/2015 | Huang | H10H 20/841 |
| | | | | 257/79 |
| 9,797,567 | B2 | 10/2017 | Kastner-Jung et al. | |
| 2003/0143424 | A1 * | 7/2003 | Steklenski | G21K 4/00 |
| | | | | 250/488.1 |
| 2008/0035944 | A1 * | 2/2008 | Eberhard | H10H 20/84 |
| | | | | 257/E33.071 |
| 2008/0211386 | A1 * | 9/2008 | Choi | H10H 20/8513 |
| | | | | 313/503 |
| 2010/0084678 | A1 | 4/2010 | Streubel et al. | |
| 2010/0309555 | A1 * | 12/2010 | Southwell | G02B 5/281 |
| | | | | 359/586 |
| 2011/0198637 | A1 * | 8/2011 | Huang | H10H 20/841 |
| | | | | 438/31 |
| 2023/0155058 | A1 * | 5/2023 | Kreiner | H10H 20/8512 |
| | | | | 257/79 |

FOREIGN PATENT DOCUMENTS

| | | | | |
|---|---|---|---|---|
| DE | 112009003123 | B4 | 2/2020 | |
| EP | 0905797 | A2 | 3/1999 | |
| EP | 1887634 | A2 * | 2/2008 | H10H 20/855 |
| WO | 0213281 | A1 | 2/2002 | |
| WO | WO-2013065172 | A1 * | 5/2013 | G02B 5/0236 |

OTHER PUBLICATIONS

Schnitzler I., et al., "30% external quantum efficiency from surface textured, thin-film light-emitting diodes," Appl. Phys. Lett. 63 (16), Aug. 9, 1993, pp. 2174-2176.

* cited by examiner

RADIATION-EMITTING COMPONENT AND METHOD FOR PRODUCING A RADIATION-EMITTING COMPONENT

This patent application is a national phase filing under section 371 of PCT/EP2021/063303, filed May 19, 2021, which claims the priority of German patent application 102020114884.4, filed Jun. 4, 2020, each of which is incorporated herein by reference in its entirety.

TECHNICAL FIELD

A radiation-emitting component is specified. In addition, a method for producing a radiation-emitting component is specified.

SUMMARY

Embodiments provide a radiation-emitting component that is particularly suitable as a radiation source for a brake light or tail light of a motor vehicle. The brake light or tail light can be arranged, for example, directly on or in a rear window of the motor vehicle. The rear window typically runs at an angle to a direction of travel of the motor vehicle. Nevertheless, road users following the motor vehicle should be able to see the brake light or tail light clearly. A further task to be solved is to specify a method for producing such a component.

In at least one embodiment, the radiation-emitting component includes a radiation-emitting emitter having a front surface and an optical element disposed on the front surface. The optical element includes a plurality of reflection surfaces and a plurality of radiation exit surfaces. Each of the reflection surfaces has an angle of inclination relative to the front surface of between 45° and 80° inclusive, particularly between 55° and 65° inclusive. During intended operation of the radiation-emitting component, electromagnetic radiation generated by the emitter is reflected at the reflection surfaces toward the radiation exit surfaces and coupled out of the optical element therethrough. A main radiation exit direction of the radiation-emitting component includes an exit angle between 10° and 80°, inclusive, with the front side. In particular, the exit angle is between inclusive 20° and inclusive 45° or between inclusive 50° and inclusive 70° inclusive, preferably between inclusive 25° and inclusive 35°. The main emission direction is the direction in which an electromagnetic radiation emerging from the radiation-emitting component has its intensity maximum.

The emitter is arranged to generate electromagnetic radiation from a wavelength range between and including the IR range and including the UV range. The emitter is preferably a so-called surface emitter. By this is meant that in operation at least 70% or 80% or 90% of the total radiation emitted by the emitter emerges from the emitter through the front side of the emitter.

The optical element is in direct contact with the front side, for example. On a side of the optical element facing away from the front side, the optical element is preferably structured and has a plurality of structural units. In particular, each structural unit has one, for example exactly one, reflection surface and one, for example exactly one, radiation exit surface. For example, the structural units are regularly arranged next to each other as seen from the emitter. In particular, they are arranged at the nodes of a regular one-dimensional or two-dimensional lattice.

Alternatively, the structural units are arranged irregularly next to each other, for example.

During intended operation, at least part of the radiation hits the reflection surfaces at angles that fulfill the condition for total reflection. This part of the radiation is totally reflected at the reflection surfaces. For example, at least 30% or at least 50% or at least 70% of the radiation generated by the emitter is reflected at the reflection surfaces.

One of the technical features underlying a radiation-emitting semiconductor chip described herein is as follows. In many applications of radiation-emitting components, it is desirable for the main emission direction to include a predetermined angle with a main extension direction of the component. This is the case, for example, when a surface on which the component is mounted is inclined, particularly oblique, with respect to the desired main emission direction. This cannot be satisfactorily achieved with conventional emitters, for example surface emitters with Lambertian emission characteristics.

Embodiments provide placing an optical element downstream of an emitter. The optical element directs a radiation emitted from the emitter in a desired main emission direction of the component. The component includes a desired exit angle with a main extension plane of the emitter.

The radiation-emitting component described herein is particularly suitable as a tail light or brake light for a motor vehicle. A radiation-emitting component described herein can be formed in a compact manner. For example, the tail light is arranged directly on or in a rear window of the motor vehicle. For example, the rear window includes an acute angle of incidence with a direction of travel of the motor vehicle. In other words, the rear window runs obliquely to the direction of travel. For example, the angle of attack of the rear window is between and including 10° and 80°, for example about 30° or about 60°. Preferably, the component has an exit angle that compensates for an inclination of the rear window such that the main emission direction emitted by the component is antiparallel to the direction of travel of the vehicle. In particular, the exit angle coincides with the angle of attack of the rear window. For example, the exit angle is about 30° or about 60°. This allows road users following the motor vehicle to perceive the rear light or brake light particularly well, despite its placement on an inclined surface.

The component disclosed here is also suitable, for example, as a radiation source in a spotlight or in a projector.

According to at least one embodiment of the radiation-emitting component or one of its embodiments described above, a mirror layer is disposed on each of the reflection surfaces. By arranging a mirror layer at each of the reflection surfaces, the reflectivity of the reflection surfaces can be further increased.

According to at least one embodiment of the component or one of its embodiments described above, a dielectric filter is arranged between the front surface and the optical element. In particular, the dielectric filter is arranged to transmit radiation having an entrance angle within a first angular range and to reflect radiation having an entrance angle within a second angular range. Operating principles and examples of such a filter are described, for example, in the publication US 2008/0035944, the disclosure content of which is hereby incorporated by reference. The dielectric filter can be used to ensure that a particularly high proportion of the radiation propagating in the optical element during operation strikes a reflection surface at an angle at which the radiation is reflected.

According to at least one embodiment of the radiation-emitting component or one of its embodiments described above, the emitter is a Lambertian emitter. By this is meant that the emitter has a Lambertian emission characteristic. For example, the emitter is an inorganic or organic light emitting diode element.

According to at least one embodiment of the radiation-emitting component or one of its embodiments described above, the emitter is an inorganic semiconductor chip. For example, the emitter is a light emitting diode chip, preferably a thin film light emitting diode chip. A working principle of a thin-film light-emitting diode chip is described, for example, in the publication I. Schnitzler et al, Appl. Phys. Lett. 63 (16) Oct. 18, 1993, pages 2174-2176, which is hereby incorporated herein by reference in its entirety. Examples of thin film light emitting diode chips are described in EP 0905797 A2 and WO 02/13281 A1, which is also hereby incorporated herein by reference in its entirety.

A method for producing a radiation-emitting component is further disclosed. By means of the method, in particular, a component described above can be produced. That is, all features disclosed in connection with the method are also disclosed for the radiation-emitting component and vice versa.

According to at least one embodiment of the method, a radiation-emitting emitter is provided and at least one optical element is generated. In generating the optical element, a plurality of reflection surfaces and a plurality of radiation exit surfaces are generated in a base material. Each of the reflection surfaces has an angle of inclination of between 45° and 80°, inclusive, with respect to a main extension plane of the optical element. In a further step of the method, the optical element is disposed on a front surface of the emitter.

In particular, the base material of the optical element is structured in the production process of the optical element. In particular, a plurality of structural units of the optical element are produced. The structural units are produced, for example, by a lithography method combined with an etching method. Suitable lithography methods include, for example, grayscale lithography, nanoimprinting, or two-photon lithography comprising a two-photon process. Alternatively, it is possible that the structural units are produced by making lines in combination with a sputtering process. Due to the lines, shadowing of certain areas of the base material is achieved. In these shaded areas, preferably no or hardly any material is deposited during the sputtering process. Such a process is also known as "glancing angle deposition".

According to at least one embodiment of the method or one of its embodiments described above, a plurality of emitters is provided in a first compound. In a further step, a plurality of optical elements in a second compound is deposited or fabricated on the first compound, preferably directly on the first compound. In a further step, the compound of first and second compound is singulated into a plurality of radiation-emitting components, wherein each optical element is associated with exactly one emitter.

According to at least one embodiment of the method or one of its embodiments described above, the optical element is produced on a support element. The carrier element is, for example, a glass plate. In a further step, the carrier element is preferably applied to the front side of the emitter with a side facing away from the optical element, for example by means of bonding.

According to at least one embodiment of the method or one of its embodiments described above, a mirror layer is arranged on each of the reflection surfaces during the production of the optical element. For example, the mirror layer is vapor-deposited or deposited on the reflection surface.

According to at least one embodiment of the method or one of its embodiments described above, a dielectric mirror is arranged on the front side before arranging the optical element.

BRIEF DESCRIPTION OF THE DRAWINGS

Further advantages and advantageous designs and further developments of the radiation-emitting component and the method result from the examples of embodiments shown below in connection with schematic drawings. Elements which are identical, of the same kind and have the same effect are provided with the same reference signs in the figures. The figures and the proportions of the elements shown in the figures are not to be regarded as basically to scale. Rather, individual elements may be shown exaggeratedly large for better representability and/or for better understanding.

DETAILED DESCRIPTION OF ILLUSTRATIVE EMBODIMENTS

Figures 1, 2:
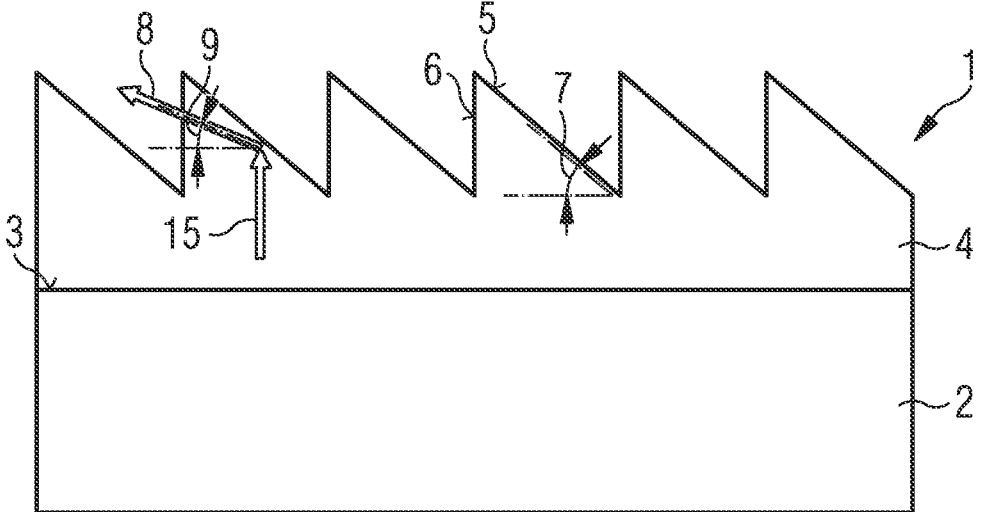
FIGS. 1 to 6 show examples of embodiments of radiation-emitting components in schematic sectional views.

FIG. 1 shows a radiation-emitting component 1 according to a first exemplary embodiment. The radiation-emitting component 1 comprises an emitter 2 having a front side 3. An optical element 4 is arranged on the front side 3. The exemplary embodiments and/or method stages shown here and below are all shown in a schematic sectional view, with the corresponding sectional plane perpendicular to the front side 3.

Herein, the emitter 2 is a thin film light emitting diode chip. The emitter 2 comprises a semiconductor body 21 having an active region for generating electromagnetic radiation. In particular, the semiconductor body 21 is based on a III-V compound semiconductor material. A surface of the semiconductor body 21 facing a front surface 3 is roughened. By roughening, the decoupling efficiency of radiation generated in the semiconductor body 21 in the intended operation can be improved from the semiconductor body 21. The emitter 2 further includes a planarization layer 22. The planarization layer 22 fills the roughness of the semiconductor body 21 and enables a smooth front surface 3. The planarization layer 22 is formed with SiO2, for example. Alternatively, it is possible that the planarization layer 22 comprises an adhesive, for example a silicone-based adhesive. The adhesive serves, for example, as an adhesive layer to the optical element 4.

A base material of the optical element 4 is preferably transparent, in particular transparent to the radiation generated by the emitter 2 during operation. The optical element 4 comprises, for example, niobium oxide and/or titanium oxide or is formed from one of these materials.

A carrier element 12, for example a glass plate, is arranged between the front side 3 and the optical element 4. In particular, the optical element 4 has been fabricated on the support element 12. The optical element 4 comprises a plurality of reflection surfaces 5 and radiation exit surfaces 6 arranged side by side as viewed from the emitter 2, with reflection surfaces 5 and radiation exit surfaces 6 alternating. The reflection surfaces 5 have an angle of inclination 7 with respect to the front surface 3. The radiation exit surfaces 6 are oriented perpendicular to the front side 3. In particular, two adjacent reflection surfaces 5 are connected to each other via a radiation exit surface 6. A side of the optical element 4 facing away from the front side has, for example, a sawtooth structure.

A mirror layer 10 is disposed at each of the reflection surfaces 5. The mirror layer 10 comprises, for example, a metal mirror formed of silver or a silver alloy, or a dielectric mirror such as a Bragg mirror. On a side of the optical element facing away from the front side, another planarization layer 13 is arranged to completely cover the reflection surfaces 5 and radiation exit surfaces 6.

FIG. 2 illustrates a functional principle of a component 1 according to a second exemplary embodiment in which, in contrast to the component 1 of FIG. 1, the optical element 4 is arranged directly on the front side 3. Furthermore, the component 1 of FIG. 2 does not comprise a further planarization layer 13.

Radiation that emerges from the emitter 2 perpendicular to the front side 3 during operation is reflected at the reflection surface 5 and emerges from the optical element 4 via the radiation exit surface 6. A main emission direction 8 of the emitted radiation thereby has an exit angle 9 with respect to the front side 3. The arrows indicate a main propagation direction 15 of the radiation in the optical element 4 and the main emission direction 8, respectively. The main propagation direction 15 is the direction in which the electromagnetic radiation propagating in the optical element 4 during operation has the maximum intensity.

Figures 3, 4:
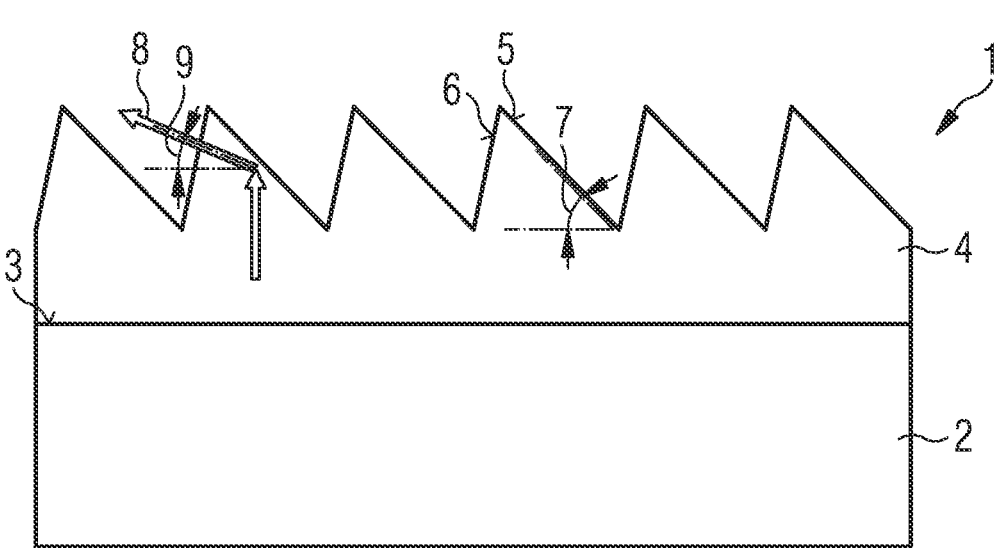

FIG. 3 shows essentially the same features as FIG. 2 with the difference that the radiation exit surfaces 6 are not oriented perpendicular to the front, but enclose an acute angle with the front. By the angle of the radiation exit surfaces 6 to the front 3 the exit angle 9 is further influencable.

The exemplary embodiment of the component 1 of FIG. 4 differs from the component 1 of FIG. 2 in that a dielectric filter 11 is arranged between the optical element 4 and the emitter 2. The dielectric filter 11 is arranged to transmit radiation having an entrance angle within a first angular range and to reflect radiation having an entrance angle within a second angular range. In the dielectric filter 11 of FIG. 6, radiation is preferably transmitted such that it has a main propagation direction 15 within the optical element 4 which includes an angle of about 60° with respect to the front side 3. Radiation with such a main propagation direction 15 advantageously strikes reflection surfaces 5 of the optical element 4 at an angle which allows a particularly large proportion of the radiation to be reflected.

Figures 5, 6:
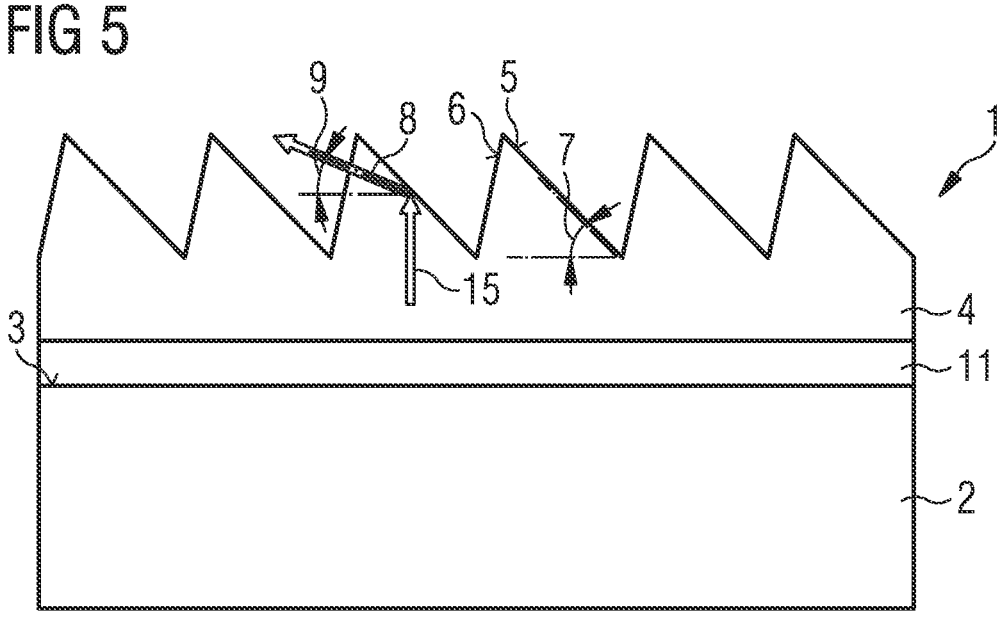

The radiation-emitting component 1 of FIG. 5 has substantially the same features as the component 1 of FIG. 6, except that the filter 11 is arranged to preferentially transmit radiation such that it propagates within the optical element 4 with a main propagation direction 15 perpendicular to the front side.

In the radiation-emitting component 1 of FIG. 6, the reflection surfaces 5 have a mirror layer 10, in contrast to FIG. 6. Furthermore, a structuring of the optical element 4 is irregular, whereby interference effects can be advantageously reduced.

Figure 7:
FIGS. 7 and 8 show cross-sectional views of two different stages of an embodiment of a process for fabricating a radiation-emitting component.
Figure 8:
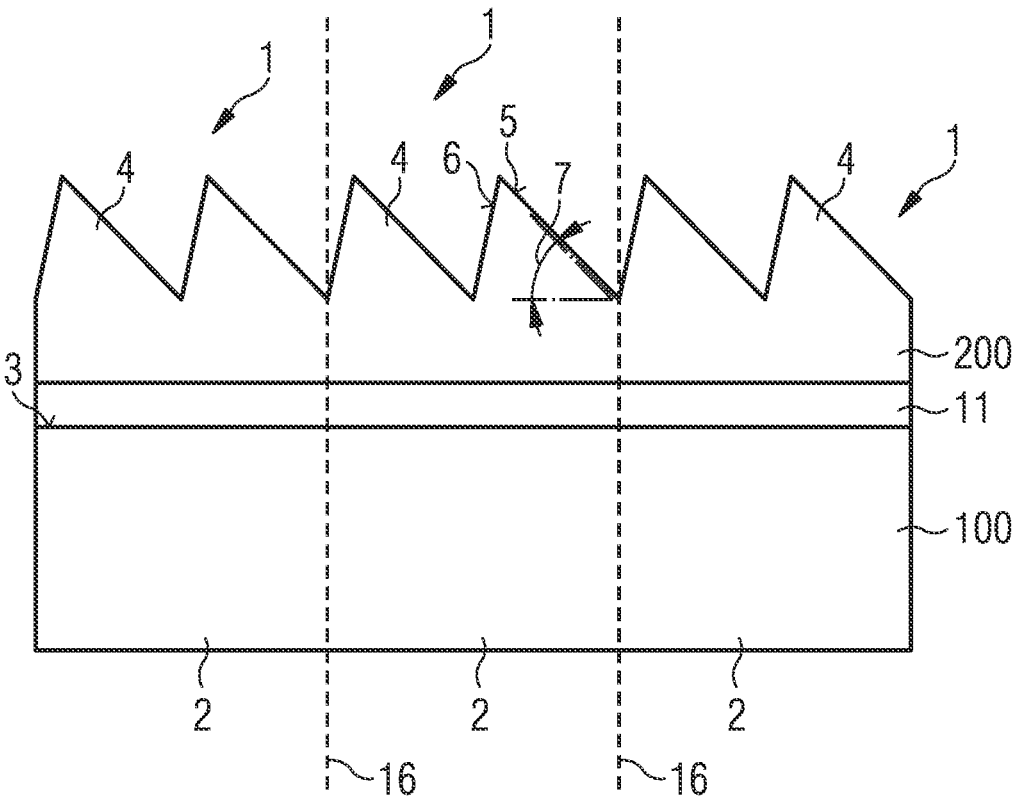

In the method shown in FIGS. 7 and 8, a plurality of emitters 2 are provided in a first compound 100 having a front side 3. In the method step shown in FIG. 7, a dielectric filter 11 is disposed on the front side 3. The dielectric filter 11 is deposited on the front side 3, for example. The dielectric filter is deposited using chemical vapor deposition (CVD), for example.

In a step following the step of FIG. 7 (see FIG. 8), a second compound 200 of a plurality of optical elements 4 is deposited on the dielectric filter 11, for example by CVD or sputtering. A side of the second compound 200 facing away from the emitter 2 is subsequently patterned (see FIG. 8). The patterning is done for example by grayscale lithography combined with an etching process.

Subsequently, the first and second compounds 100, 200 are completely separated along separation lines 16, so that a plurality of radiation-emitting components 1, for example those according to FIG. 5, is produced. The compounds 100, 200 are separated, for example, by etching, sawing and/or breaking.

The invention is not limited to these by the description based on the embodiments. Rather, the invention encompasses any new feature as well as any combination of features, which in particular includes any combination of features in the patent claims, even if this feature or combination itself is not explicitly stated in the patent claims or embodiments.

The invention claimed is:

1. A radiation-emitting component comprising:
   a radiation-emitting emitter having a front side;
   an optical element arranged on the front side; and
   a dielectric filter arranged between the front side and the optical element,
   wherein the optical element comprises a plurality of reflection surfaces and a plurality of radiation exit surfaces,
   wherein each of the reflection surfaces has an angle of inclination of between 45° and 80°, inclusive, with respect to the front side,
   wherein the emitter is configured to emit electromagnetic radiation generated that is reflected at the reflection surfaces towards the radiation exit surfaces and emerges from the optical element via the radiation exit surfaces,
   wherein a main emission direction of the radiation-emitting component includes an exit angle between 10° and 80°, inclusive, with the front side, and
   wherein the dielectric filter is configured to transmit radiation having an entrance angle within a first angular range and to reflect radiation having an entrance angle within a second angular range.

2. The radiation-emitting component according to claim 1, further comprising a mirror layer arranged on each of the reflection surfaces.

3. The radiation-emitting component according to claim 1, wherein the emitter is configured to emit at least 70% of a total radiation emitted by the emitter through the front side of the emitter.

4. The radiation-emitting component according to claim 1,
   wherein the emitter is a Lambertian emitter, and
   wherein the emitter is an inorganic semiconductor chip or an organic light-emitting diode element.

5. A method for producing the radiation-emitting component according to claim 1, the method comprising:
   providing at least one radiation-emitting emitter;
   forming at least one optical element; and
   forming, in a base material, a plurality of reflection surfaces and a plurality of radiation exit surfaces such that each of the reflection surfaces has an angle of inclination of between 45° and 80°, inclusive, with respect to a main extension plane of the optical element, wherein the optical element is arranged at the front side of the emitter.

6. The method according to claim 5, wherein a plurality of emitters is provided in a first compound, wherein a plurality of optical elements is fabricated in a second compound on the first compound, wherein a compound of the first and second compounds is separated into a plurality of components, and wherein each optical element is assigned exactly one emitter.

7. The method according to claim 5, wherein the optical element is produced on a carrier element, and wherein the carrier element is applied to the front side of the emitter with a side facing away from the optical element.

8. The method according to claim 5, further arranging a mirror layer on each of the reflection surfaces.

9. The method according to claim 5, further comprising: arranging at least one dielectric filter at the front side before arranging the at least one optical element, wherein the dielectric filter is configured to transmit radiation having the entrance angle within the first angular range and to reflect radiation having the entrance angle within the second angular range.

10. A radiation-emitting component comprising:
a radiation-emitting emitter having a front side; and
an optical element arranged on the front side, wherein the optical element comprises a plurality of reflection surfaces and a plurality of radiation exit surfaces,
wherein each of the reflection surfaces has an angle of inclination of between 45° and 80°, inclusive, with respect to the front side,
wherein the emitter is configured to emit electromagnetic radiation generated that is reflected at the reflection surfaces towards the radiation exit surfaces and emerges from the optical element via the radiation exit surfaces,
wherein a main emission direction of the radiation-emitting component includes an exit angle between 10° and 80°, inclusive, with the front side, and
a surface of a semiconductor body of the radiation-emitting emitter facing the front side is roughened and a roughness of the semiconductor body is filled with a planarization layer comprising SiO2.

11. The radiation-emitting component according to claim 10, further comprising a mirror layer arranged on each of the reflection surfaces.

12. The radiation-emitting component according to claim 10, wherein the emitter is configured to emit at least 70% of a total radiation emitted by the emitter through the front side of the emitter.

13. The radiation-emitting component according to claim 10,
wherein the emitter is a Lambertian emitter, and
wherein the emitter is an inorganic semiconductor chip or an organic light-emitting diode element.

* * * * *